(12) United States Patent
Schleif et al.

(10) Patent No.: US 11,906,371 B2
(45) Date of Patent: Feb. 20, 2024

(54) THERMOCOUPLES FOR HIGH TEMPERATURE APPLICATIONS

(71) Applicant: General Electric Company, Schenectady, NY (US)

(72) Inventors: Kurt Kramer Schleif, Greenville, SC (US); Andrew David Ellis, Greenville, SC (US)

(73) Assignee: GE Infrastructure Technology LLC, Greenville, SC (US)

( * ) Notice: Subject to any disclaimer, the term of this patent is extended or adjusted under 35 U.S.C. 154(b) by 353 days.

(21) Appl. No.: 17/082,056

(22) Filed: Oct. 28, 2020

(65) Prior Publication Data

US 2021/0123814 A1     Apr. 29, 2021

Related U.S. Application Data

(60) Provisional application No. 62/926,674, filed on Oct. 28, 2019.

(51) Int. Cl.
| | |
|---|---|
| *G01K 7/02* | (2021.01) |
| *G01K 1/14* | (2021.01) |
| *H10N 10/00* | (2023.01) |
| *H10N 10/80* | (2023.01) |
| *H10N 10/85* | (2023.01) |

(52) U.S. Cl.
CPC .............. *G01K 7/02* (2013.01); *G01K 1/14* (2013.01); *H10N 10/00* (2023.02); *H10N 10/80* (2023.02); *H10N 10/85* (2023.02); *F05D 2220/30* (2013.01); *F05D 2270/303* (2013.01)

(58) Field of Classification Search
CPC ......... H10N 10/80; H10N 10/00; H10N 10/85
USPC ........................................................ 374/179
See application file for complete search history.

(56) References Cited

U.S. PATENT DOCUMENTS 3,508,974 A * 4/1970 Bressler ................. H01L 35/06
136/205

FOREIGN PATENT DOCUMENTS

KR       2017019272 A *  2/2017    ............... G01K 7/02

OTHER PUBLICATIONS

Wang et al., A Handy Flexible Micro-Thermocouple Using Low-Melting-Point Metal Alloys, Sensors (Basel), PMCID6359204, vol. 19, No. 2, Jan. 2019, 14 Pages. https://www.ncbi.nlm.nih.gov/pmc/articles/PMC6359204/.

(Continued)

*Primary Examiner* — Mirellys Jagan
(74) *Attorney, Agent, or Firm* — Dority & Manning, P.A.

(57) ABSTRACT

Thermocouples for high temperature applications are provided. A thermocouple includes a vessel formed from a dielectric material, the vessel defining a first chamber and a second chamber, the first chamber and second chamber in fluid communication. The thermocouple further includes a first thermoelement disposed in the first chamber, the first thermoelement formed from a first thermoelectric material. The thermocouple further includes a second thermoelement disposed in the second chamber, the second thermoelement formed from a second thermoelectric material different from the first thermoelectric material, and wherein the second thermoelement is a liquid at operating conditions of the thermocouple.

19 Claims, 2 Drawing Sheets

(56) References Cited

OTHER PUBLICATIONS

Wang et al., A Handy Flexible Micro-Thermocouple Using Low-Melting-Point Alloys, MDPI, Journal Sensors, vol. 19, No. 314, 2019, 10 Pages. https://www.mdpi.com/1424-8220/19/2/314/pdf-vor doi: 10.3390/s19020314.

Li et al, Printable Tiny Thermocouple by Liquid Metal Gallium and its Matching Metal, Applied Physics Letters, vol. 101, Issue 7, 10.1063/1.4746397, 2012, 5 Pages. Abstract Only https://aip.scitation.org/doi/10.1063/1.4746397.

\* cited by examiner

THERMOCOUPLES FOR HIGH TEMPERATURE APPLICATIONS

CROSS-REFERENCE TO RELATED APPLICATIONS

The present application is a non-provisional application, which claims priority to U.S. Provisional Application Ser. No. 62/926,674, filed Oct. 28, 2019, the entire disclosure of which is incorporated by reference herein.

FIELD

The present disclosure relates generally to thermocouples for high temperature applications, such as for use in turbomachines.

BACKGROUND

Turbomachines are utilized in a variety of industries and applications for energy transfer purposes. For example, a gas turbine engine generally includes a compressor section, a combustion section, a turbine section, and an exhaust section. The compressor section progressively increases the pressure of a working fluid entering the gas turbine engine and supplies this compressed working fluid to the combustion section. The compressed working fluid and a fuel (e.g., natural gas) mix within the combustion section and burn in a combustion chamber to generate high pressure and high temperature combustion gases. The combustion gases flow from the combustion section into the turbine section where they expand to produce work. For example, expansion of the combustion gases in the turbine section may rotate a rotor shaft connected, e.g., to a generator to produce electricity. The combustion gases then exit the gas turbine via the exhaust section.

Turbomachines are one example of high-temperature applications wherein thermocouples are utilized to measure temperatures. Thermocouples are generally utilized to monitor temperatures. Known thermocouples are generally formed by creating a junction (typically via welding) between two solid metals (e.g. wires) of dissimilar composition. Exposure of this junction to heat generates an electromagnetic field which is proportional to the temperature (known as the Seebeck effect). Accordingly, the temperature and fluctuations thereof can be calculated with high accuracy.

Issues exist with the use of known thermocouples in high temperature applications. As the temperature approaches the melting temperature of the solid materials, the usable life of the thermocouple significantly declines. The thermocouple can quickly fail at high temperatures due to, for example, oxidation and/or junction separation. Known thermocouples are generally only usable in an oxidizing environment up to a maximum temperature based on their material composition. For example, an ANSI Type B thermocouple, which utilizes platinum-rhodium elements, has a maximum operating temperature in the range of 2900 to 3100 Fahrenheit. As the temperatures utilized in high temperature applications, such as in turbomachines, increases, thermocouples which can withstand and perform at these increased temperatures are desired and would be advantageous.

BRIEF DESCRIPTION

Aspects and advantages of the thermocouples in accordance with the present disclosure will be set forth in part in the following description, or may be obvious from the description, or may be learned through practice of the technology.

In accordance with one embodiment, a thermocouple is provided. The thermocouple includes a vessel formed from a dielectric material, the vessel defining a first chamber and a second chamber, the first chamber and second chamber in fluid communication. The thermocouple further includes a first thermoelement disposed in the first chamber, the first thermoelement formed from a first thermoelectric material. The thermocouple further includes a second thermoelement disposed in the second chamber, the second thermoelement formed from a second thermoelectric material different from the first thermoelectric material, and wherein the second thermoelement is a liquid at operating temperatures of the thermocouple.

In accordance with another embodiment, a turbomachine is provided. The turbomachine includes a compressor section, a combustor section, a turbine section, and a thermocouple disposed at least partially in one of the compressor section, the combustor section, or the turbine section. The thermocouple includes a vessel formed from a dielectric material, the vessel defining a first chamber and a second chamber, the first chamber and second chamber in fluid communication. The thermocouple further includes a first thermoelement disposed in the first chamber, the first thermoelement formed from a first thermoelectric material. The thermocouple further includes a second thermoelement disposed in the second chamber, the second thermoelement formed from a second thermoelectric material different from the first thermoelectric material, and wherein the second thermoelement is a liquid at operating temperatures of the thermocouple.

These and other features, aspects and advantages of the present thermocouples will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION

A full and enabling disclosure of the present thermocouples, including the best mode of making and using the present systems and methods, directed to one of ordinary skill in the art, is set forth in the specification, which makes reference to the appended figures, in which.

DETAILED DESCRIPTION

Figure 1:
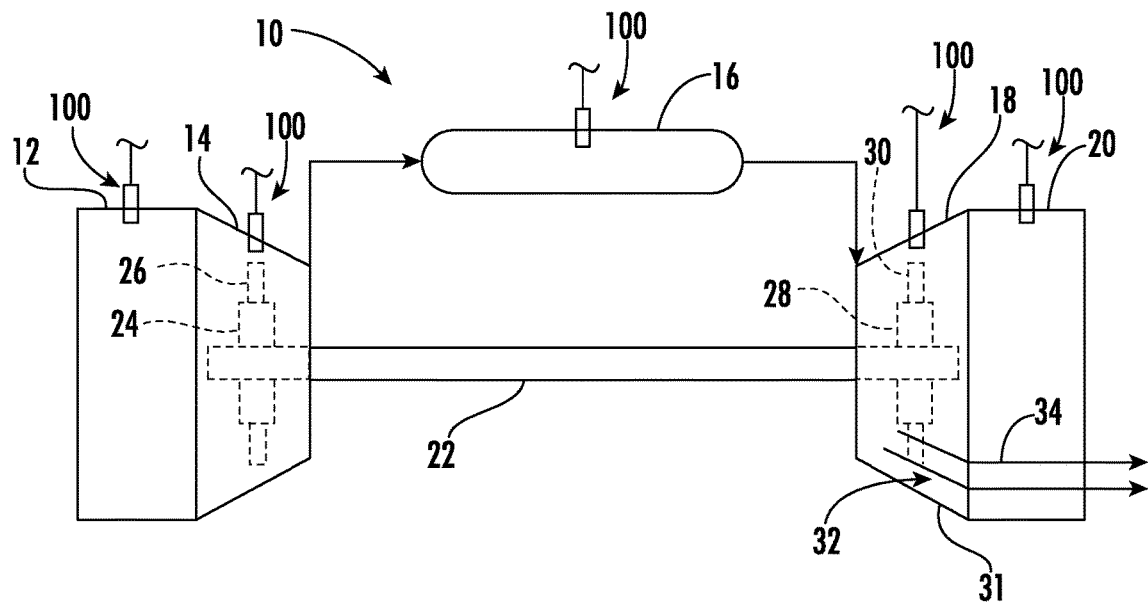
FIG. 1 is a schematic illustration of a turbomachine in accordance with embodiments of the present disclosure.

Reference now will be made in detail to embodiments of the present thermocouples, one or more examples of which are illustrated in the drawings. Each example is provided by way of explanation, rather than limitation of, the technology. In fact, it will be apparent to those skilled in the art that various modifications and variations can be made in the present technology without departing from the scope or spirit of the claimed technology. For instance, features illustrated or described as part of one embodiment can be used with another embodiment to yield a still further embodiment. Thus, it is intended that the present disclosure covers such modifications and variations as come within the scope of the appended claims and their equivalents.

The detailed description uses numerical and letter designations to refer to features in the drawings. Like or similar designations in the drawings and description have been used to refer to like or similar parts of the invention. As used herein, the terms "first", "second", and "third" may be used interchangeably to distinguish one component from another and are not intended to signify location or importance of the individual components.

Referring now to the drawings, FIG. 1 illustrates a schematic diagram of one embodiment of a turbomachine, which in the illustrated embodiment is a gas turbine 10. Although an industrial or land-based gas turbine is shown and described herein, the present disclosure is not limited to a land based and/or industrial gas turbine unless otherwise specified in the claims. For example, the invention as described herein may be used in any type of turbomachine including but not limited to a steam turbine, an aircraft gas turbine or marine gas turbine.

As shown, gas turbine 10 generally includes an inlet section 12, a compressor section 14 disposed downstream of the inlet section 12, a plurality of combustors (not shown) within a combustor section 16 disposed downstream of the compressor section 14, a turbine section 18 disposed downstream of the combustor section 16 and an exhaust section 20 disposed downstream of the turbine section 18. Additionally, the gas turbine 10 may include one or more shafts 22 coupled between the compressor section 14 and the turbine section 18.

The compressor section 14 may generally include a plurality of rotor disks 24 (one of which is shown) and a plurality of rotor blades 26 extending radially outwardly from and connected to each rotor disk 24. Each rotor disk 24 in turn may be coupled to, or form, a portion of the shaft 22 that extends through the compressor section 14.

The turbine section 18 may generally include a plurality of rotor disks 28 (one of which is shown) and a plurality of rotor blades 30 extending radially outwardly from and being interconnected to each rotor disk 28. Each rotor disk 28 in turn may be coupled to, or form, a portion of the shaft 22 that extends through the turbine section 18. The turbine section 18 further includes an outer casing 31 that circumferentially surrounds the portion of the shaft 22 and the rotor blades 30, thereby at least partially defining a hot gas path 32 through the turbine section 18.

During operation, a working fluid such as air flows through the inlet section 12 and into the compressor section 14 where the air is progressively compressed, thus providing pressurized air to the combustors of the combustion section 16. The pressurized air is mixed with fuel and burned within each combustor to produce combustion gases 34. The combustion gases 34 flow through the hot gas path 32 from the combustor section 16 into the turbine section 18, where energy (kinetic and/or thermal) is transferred from the combustion gases 34 to the rotor blades 30, thus causing the shaft 22 to rotate. The mechanical rotational energy may then be used to power the compressor section 14 and/or to generate electricity. The combustion gases 34 exiting the turbine section 18 may then be exhausted from the gas turbine 10 via the exhaust section 20.

As illustrated, one or more thermocouples 100 may be disposed at least partially in one or more of the compressor section 14, combustor section 16, turbine section 18, and/or exhaust section 20. Thermocouples 100 may advantageously be utilized to measure temperatures within such compressor section 14, combustor section 16, turbine section 18, exhaust section 20, or other portions of the gas turbine 10. In exemplary embodiments, one or more thermocouples 100 may be disposed at least partially in the combustor section 16.

Thermocouples 100 in accordance with the present disclosure are particularly and advantageously suitable for high temperature applications, such as applications approaching and exceeding the range of 2900 to 3100 degrees Fahrenheit. For example, thermocouples 100 in accordance with the present disclosure may be particularly advantageous in the combustor section 16 and turbine section 18, where temperatures are the highest. For example, thermocouples 100 in accordance with the present disclosure may eliminate the mechanical junction between the two solid metals by utilizing a wet junction wherein at least one of the two thermoelements is a liquid at the operating temperature of the thermocouple 100. Such wet junctions can advantageously provide an increased level of contact, thus ensuring reliable measurements, and can resist thermal stresses and oxidation during operation.

It should be understood that the present disclosure is not limited to the use of such improved thermocouples in only turbomachines or in only high temperature applications such as those approaching and exceeding the range of 2900 to 3100 degrees Fahrenheit. Rather, any suitable use of such inventive thermocouples is within the scope and spirit of the present disclosure. Temperatures at which the present thermocouples 100 may be used are described herein as the operating temperatures of the thermocouple and may encompass a broader temperature range than the high temperature application range described above. For instance, because at least one of the thermoelements in the present thermocouple has a melting point below room temperature (e.g., mercury, which has a melting point of −38 degrees Fahrenheit) or has a melting point above ambient but considerably less than those found in high temperature applications (e.g., gallium, cesium, and rubidium, which have melting points between 83 degrees Fahrenheit and 103 degrees Fahrenheit), the use of the present thermocouple 100 may be suitable for a wide range of industrial applications, in addition to those high temperature applications for which the present thermocouple 100 is particularly well-suited.

Figure 2:
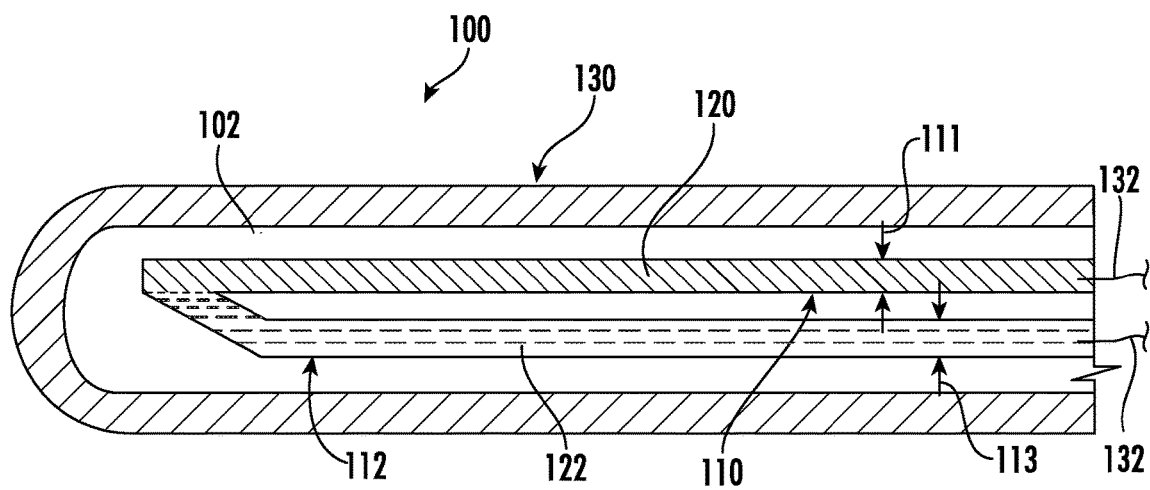
FIG. 2 is a schematic illustration of a thermocouple in accordance with embodiments of the present disclosure.
Figure 3:
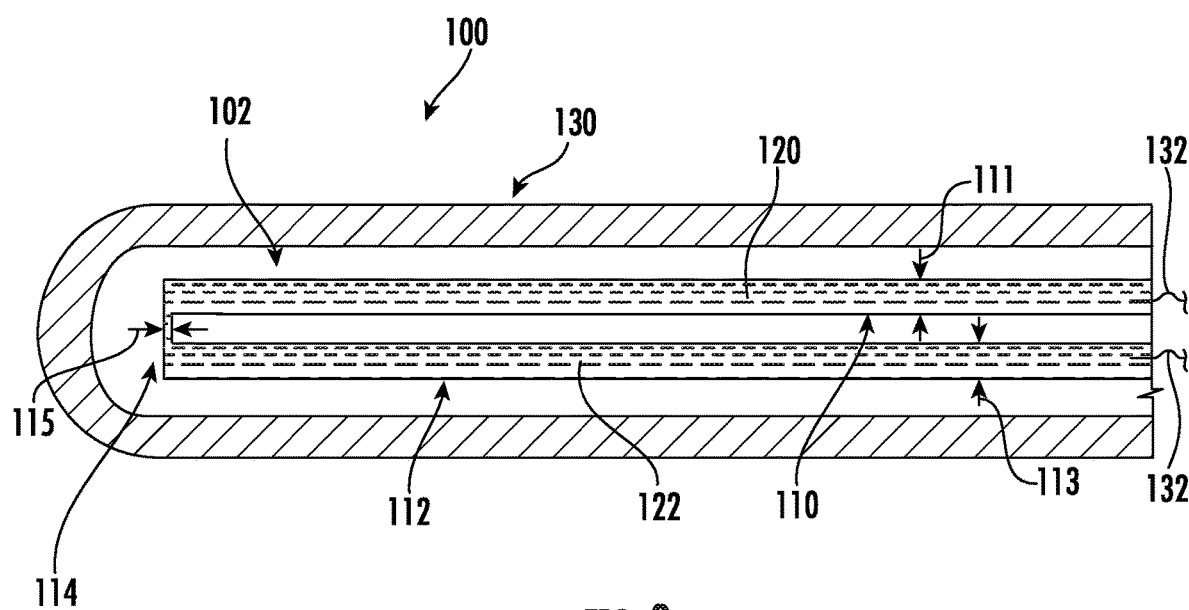
FIG. 3 is a schematic illustration of a thermocouple in accordance with other embodiments of the present disclosure.

Referring now to FIGS. 2 and 3, embodiments of thermocouples 100 in accordance with the present disclosure are provided. A thermocouple 100 in accordance with the present disclosure may include a vessel 102. Vessel 102 may be a monolithic structure or may be formed from multiple separate structures which are connected together to form the vessel. Vessel 102 may be formed from a dielectric material and may generally house the thermoelements, which provide the thermoelectric connection that allows the thermocouple 100 to function. For example, in some embodiments, vessel 102 may be formed from sapphire. One exemplary embodiment is a monolithic sapphire vessel 102. Additionally, or alternatively, ceramic, glass, quartz, silica, and/or other suitable dielectric materials may be utilized in the vessel 102.

Various chambers and/or passages may be defined in the vessel 102. In some embodiments, the vessel 102 may be "grown" to include such chambers and/or passages therein, while in alternative embodiments such chambers and/or passages may be formed via a secondary step after production of the vessel 102.

For example, a first chamber 110 and a second chamber 112 may be defined in the vessel 102, as shown. The first chamber 110 and second chamber 112 may be in fluid communication, such that a junction can be established between materials disposed in the first chamber 110 and second chamber 112.

First chamber 110 and second chamber 112 may have any suitable size. In some exemplary embodiments, the first chamber 110 and second chamber 112 may each have a maximum diameter 111, 113, respectively, of between 0.005 inches and 0.02 inches, such as between 0.007 inches and 0.013 inches, or such as between 0.009 inches and 0.011 inches.

In some embodiments, as illustrated in FIG. 2, the first chamber 110 and second chamber 112 may be in direct fluid communication, such that material exiting an end of one chamber 110, 112 directly enters the other chamber 112, 110. In other embodiments, as illustrated in FIG. 3, the first chamber 110 and second chamber 112 may be in indirect fluid communication. For example, as shown in the embodiment illustrated in FIG. 3, a junction passage 114 may be defined in the vessel 102. Junction passage 114 may provide the fluid communication between the first chamber 110 and the second chamber 112. For example, one end of junction passage 114 may be in direct fluid communication with the first chamber 110, and another end of junction passage 114 may be in direct fluid communication with the second chamber 112. Accordingly, material exiting a chamber 110, 112 may enter the junction passage 114 and may exit the junction passage 114 into the other chamber 112, 110.

In exemplary embodiments, the junction passage 114 may have a maximum outer diameter 115 that is less than one or both of the outer diameters 111, 113. The junction passage 114 may, for example, be sized such that hydrostatic tension between liquid materials in the chambers 110, 112 allows contact between the liquid materials but limits or prevents mixing of the liquid materials in the junction passage 114. In some exemplary embodiments, the junction passage 114 may have a maximum outer diameter of between 0.001 inches and 0.01 inches, such as between 0.003 inches and 0.007 inches, or such as between 0.004 inches and 0.006 inches.

Referring still to FIGS. 2 and 3, a thermocouple 100 in accordance with the present disclosure further includes a first thermoelement 120 and a second thermoelement 122. The first thermoelement 120 may be formed from a first thermoelectric material and may be disposed in the first chamber 110. The second thermoelement 122 may be formed from a second thermoelectric material and may be disposed in the second chamber 112. The second thermoelectric material is different (e.g., having a different chemical composition or having different percentages of the same chemical constituents) from the first thermoelectric material. The first and second thermoelectric materials 120, 122 may be in direct contact with each other, such that an electromagnetic field is generated when the thermocouple 100 is exposed to heat. This electromagnetic field can be measured, and a temperature or variance in the electromagnetic field can be calculated.

The second thermoelement 122 may be a liquid at operating temperatures of the thermocouple 100. Suitable thermoelectric materials for use as second thermoelement 122 include, for example, gallium, gallium alloys, cesium, cesium alloys, rubidium, rubidium alloys, mercury, and/or mercury alloys. Notably, such materials may be solid at certain low temperature ranges while liquid at even moderately elevated temperature ranges, as well as the high temperature ranges for which the use of the present thermocouple 100 is contemplated. The requirement of the second thermoelement 122 being liquid may generally apply when in an operative, high temperature state, which allows a wet junction to be formed with the first thermoelement 120 such that welding or another type of dry junction is not necessary.

The first thermoelement 120 may be a solid, as illustrated in FIG. 2, or may be a liquid, as illustrated in FIG. 3. If a solid, suitable thermoelectric materials for use as first thermoelement 120 include, for example, platinum, platinum alloys (such as in some embodiments a platinum-rhodium alloy), tungsten, rhenium, etc. If a liquid in operating temperatures of the thermocouple 100, suitable thermoelectric materials for use as first thermoelement 120 include, for example, gallium, gallium alloys, cesium, cesium alloys, rubidium, rubidium alloys, mercury, and/or mercury alloys. Notably, such materials may be solid at certain low temperature ranges while liquid at certain high temperature ranges. The requirement of the first thermoelement 120 being solid or liquid may generally apply when in an operative, high temperature state as discussed above with respect to second thermoelement 122.

In some embodiments in which the first thermoelement 120 is solid, the first and second chambers 110, 112 may be in direct fluid communication, as illustrated in FIG. 2. Further, the contact and resulting wet junction between first thermoelement 120 and second thermoelement 122 may occur in the first chamber 110, second chamber 112, or the intersection between the first and second chambers 110, 112.

In some embodiments in which the first thermoelement 120 is liquid at the operating temperatures of the thermocouple 100, the first and second chambers 110, 112 may be in direct fluid communication. Further, the contact and resulting wet junction between first thermoelement 120 and second thermoelement 122 may occur in the first chamber 110, second chamber 112, or the intersection between the first and second chambers 110, 112. In other embodiments in which the first thermoelement 120 is liquid at the operating temperatures of the thermocouple 100, the first and second chambers 110, 112 may be in indirect fluid communication via junction passage 114. Further, the contact and resulting wet junction between first thermoelement 120 and second thermoelement 122 may occur in the first chamber 110, second chamber 112, junction passage 114, the intersection between the first chamber 110 and junction passage 114, or the intersection between the second chamber 112 and junction passage 114.

In some embodiments, as illustrated in FIGS. 2 and 3, a cap 130 may surround the vessel 102. Cap 130 may generally provide an outer protective sheathing for the vessel 102 to protect the vessel 102 and thermocouple 100 generally in a high temperature environment. Suitable materials for use as cap 130 include, for example, platinum, platinum alloys (such as in some embodiments a platinum-rhodium alloy), iridium, iridium alloys (such as iridium-platinum), ceramics (such as silicon carbide), and the like. The cap 130 may advantageously provide additional strength to the thermocouple 100 under an external load, such as the flow of air. In environments or applications where no external load is present, the thermocouple 100 may not include a cap 130.

In some embodiments, one or more wires 132 may extend from the vessel 102, such as from the first chamber 110 and second chamber 112. For example, a first wire 132 may extend from the first chamber 110, and a second wire 132 may extend from the second chamber 112. Such wires 132 may be in contact with the first thermoelement 120 and second thermoelement 122. The wires 132 may extend from the vessel 102 and chambers 110, 112 and be connected at a distal end thereof (which may be out of a high temperature zone in which the vessel 102 is at least partially disposed) to a voltmeter or other suitable apparatus for measuring a generated electromagnetic field and for calculating a temperature or variance therein, as discussed herein. Such wires 132 may, for example, be formed from copper, copper alloys, constantan, chromel, alumel, nisil, nicrosil, and the like. The wires may generally be formed from the same material as each other.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A thermocouple, comprising:
   a vessel formed from a dielectric material, the vessel defining a first chamber and a second chamber, the first chamber and second chamber being in fluid communication;
   a first thermoelement disposed in the first chamber, the first thermoelement being formed from a first thermoelectric material, wherein the first thermoelement defines a first outer diameter;
   a second thermoelement disposed in the second chamber, the second thermoelement being formed from a second thermoelectric material different from the first thermoelectric material, wherein the second thermoelement is a liquid at operating temperatures of the thermocouple, and wherein the second thermoelement defines a second outer diameter; and
   a junction passage defined in the vessel and providing for the fluid communication between the first chamber and the second chamber, wherein the junction passage defines a third diameter that is less than at least one of the first outer diameter or the second outer diameter, the third diameter being sized such that hydrostatic tension between the first and the second thermoelectric materials allows for contact between the first and the second thermoelectric materials but prevents mixing of the first and the second thermoelectric materials.

2. The thermocouple of claim 1, wherein the first thermoelement is a solid.

3. The thermocouple of claim 1, wherein the first thermoelement is a liquid at operating temperatures of the thermocouple.

4. The thermocouple of claim 1, wherein the first chamber and second chamber are in direct fluid communication.

5. The thermocouple of claim 1, wherein the junction passage has a maximum diameter of between 0.001 inches and 0.01 inches.

6. The thermocouple of claim 1, wherein the first chamber and the second chamber each have a maximum diameter of between 0.005 inches and 0.02 inches.

7. The thermocouple of claim 1, wherein the first thermoelectric material is platinum or a platinum alloy.

8. The thermocouple of claim 1, wherein the second thermoelectric material is gallium or a gallium alloy.

9. The thermocouple of claim 1, wherein a maximum diameter of the junction passage is less than or equal to 50% of a maximum diameter of the first chamber and the second chamber.

10. The thermocouple of claim 1, wherein the vessel is a monolithic structure.

11. The thermocouple of claim 10, wherein the vessel is formed from sapphire.

12. The thermocouple of claim 1, further comprising a cap surrounding the vessel, the cap being spaced apart from the first thermoelement, the second thermoelement, and the junction passage.

13. The thermocouple of claim 12, wherein the cap is formed from one of platinum, platinum alloys, iridium, iridium alloys, or ceramics.

14. A turbomachine, comprising:
    a compressor section;
    a combustor section;
    a turbine section; and
    a thermocouple disposed at least partially in one of the compressor section, the combustor section, or the turbine section, the thermocouple comprising:
       a vessel formed from a dielectric material, the vessel defining a first chamber and a second chamber, the first chamber and second chamber being in fluid communication;
       a first thermoelement disposed in the first chamber, the first thermoelement being formed from a first thermoelectric material, wherein the first thermoelement defines a first outer diameter;
       a second thermoelement disposed in the second chamber, the second thermoelement being formed from a second thermoelectric material different from the first thermoelectric material, wherein the second thermoelement is a liquid at operating temperatures of the thermocouple, and wherein the second thermoelement defines a second outer diameter; and
       a junction passage defined in the vessel and providing for the fluid communication between the first chamber and the second chamber, wherein the junction passage defines a third diameter that is less than at least one of the first outer diameter or the second outer diameter, the third diameter being sized such that hydrostatic tension between the first and the second thermoelectric materials allows for contact between the first and the second thermoelectric materials but prevents mixing of the first and the second thermoelectric materials.

15. The turbomachine of claim 14, wherein the thermocouple is disposed at least partially in the combustor section.

16. The turbomachine of claim 14, wherein the first chamber and second chamber are in direct fluid communication.

17. The turbomachine of claim 14, wherein the first thermoelectric material is platinum or a platinum alloy.

18. The turbomachine of claim 14, wherein the second thermoelectric material is gallium or a gallium alloy.

19. The turbomachine of claim 14, further comprising a cap surrounding the vessel.

* * * * *